(12) United States Patent
Müller

(10) Patent No.: US 6,815,909 B2
(45) Date of Patent: Nov. 9, 2004

(54) CIRCUIT ARRANGEMENT FOR GENERATING A HIGH VOLTAGE

(75) Inventor: Heinrich Müller, Lautenbach (DE)

(73) Assignee: J. Schneider Elektrotechnik GmbH, Offenburg (DE)

( * ) Notice: Subject to any disclaimer, the term of this patent is extended or adjusted under 35 U.S.C. 154(b) by 0 days.

(21) Appl. No.: 10/308,667

(22) Filed: Dec. 3, 2002

(65) Prior Publication Data

US 2003/0102822 A1 Jun. 5, 2003

(30) Foreign Application Priority Data

Dec. 5, 2001  (DE) .......................................... 101 59 675

(51) Int. Cl.⁷ .............................................. H05B 41/16
(52) U.S. Cl. ....................... 315/274; 315/276; 315/246; 315/312
(58) Field of Search ................................ 315/274, 276, 315/279, 282, 291, 224, 246, 312, 316, 277, 209 R, 212–214, 222, 225

(56) References Cited

U.S. PATENT DOCUMENTS

| | | | |
|---|---|---|---|
| 4,734,624 A | * | 3/1988 | Nagase et al. ............... 315/243 |
| 5,087,859 A | * | 2/1992 | Blankers .................. 315/209 R |
| 5,801,491 A | * | 9/1998 | Canova ...................... 315/224 |
| 6,381,551 B1 | * | 4/2002 | Raiser ........................ 702/107 |
| 6,452,815 B1 | * | 9/2002 | Zhu et al. ..................... 363/17 |

* cited by examiner

Primary Examiner—Tuyet Thi Vo
(74) Attorney, Agent, or Firm—Klaus J. Bach

(57) ABSTRACT

In a circuit arrangement and a method for generating a high voltage for example for the operation of a plasma, comprising an impedance converter and a transformer including a primary coil and a secondary coil, by which the high voltage is provided, bridging switch members are arranged in the circuit and one of the primary and the secondary coil is short-circuited when a discharge occurs until the discharge is completed.

4 Claims, 2 Drawing Sheets

# CIRCUIT ARRANGEMENT FOR GENERATING A HIGH VOLTAGE

BACKGROUND OF THE INVENTION

The invention relates to a circuit arrangement providing a high voltage especially for the generation of a plasma, including an impedance converter with a switching device, a first diode and a first inductivity and further a transformer with a primary coil and a secondary coil generating the high voltage. The invention also relates to a method for generating and maintaining the plasma.

A similar circuit arrangement is know for example from U.S. Pat. No. 4,034,280. In this circuit arrangement, a DC voltage is first smoothened by means of an LC member and is supplied to the collector of a transistor serving as a switching member. The emitter of the transistor is connected to the cathode of a diode whose anode is grounded and which is connected to an inductivity in the form of a coil. The transistor, the diode and the inductivity form a so-called impedance converter.

The other end of the coil is connected to a center tab of the primary coil of a transformer. The two outer ends of the primary coil of the transformer are each connected to the collector of a switching transistor whose emitters are connected to ground. The bases of the switching transistors are connected to a square wave generator. In this way, the direction of the magnetic flux of the primary coil can be reversed in synchronism with the square wave generator.

The transformer includes three secondary coils each of which is connected to a bridge rectifier. At the exits of the bridge rectifier a DC voltage is provided which is smoothened by a smoothing condenser.

It is also known to use such a circuit for generating and monitoring a plasma.

For plasma generators various circuit arrangements are known, all in the form of voltage sources. They all are provided at their exits with an energy storage element such as a smoothing condenser for smoothing the output voltage. These energy storage elements however are disadvantageous when a spark or a discharge, that is, a so-called ARC, occurs in the plasma, since the energy supply to the plasma must be reduced or interrupted in order to suppress the spark. Since the storage elements however continue to supply energy, an energy supply reduction or interruption can be achieved only with additional expenditures.

It is further known that sparking occurs relatively rarely, if the plasma generator is operated by a pulsed voltage. With the application of a pulsed voltage therefore a more stable plasma can be achieved.

It is the object of the present invention to provide a circuit arrangement for generating a high voltage in such a way that the circuit arrangement, after being switched off, continues to provide a residual energy at its exit. It is furthermore an object of the present invention to provide a method for generating a plasma whereby sparking in the plasma can be rapidly suppressed.

SUMMARY OF THE INVENTION

In a circuit arrangement and a method for generating a high voltage for example for the operation of a plasma, comprising an impedance converter and a transformer including a primary coil and a secondary coil by which the high voltage is provided, bridging switch members are arranged in the circuit and one of the primary and the secondary coil is short circuited when a discharge occurs until the discharge is completed.

With the bridging switch by which the primary coil of the transformer can be short-circuited, the energy supplied by the secondary coil of the transformer can be rapidly reduced. Since the primary coil of the transformer is short-circuited, no energy is supplied to the transformer. The relatively small amount of energy present in the transformer circuit, which is stored in the stray inductivity, is rapidly dissipated when the primary coil is shorted. Upon establishment of the plasma, the energy dissipation is further increased with the occurrence of an ARC because of the resulting short circuit caused thereby in the secondary coil. The secondary coil however, could also be short-circuited by separate switches.

It is particularly advantageous in this connections that the primary coil of the transformer is energized by an impedance converter since, with the primary coil short-circuited, the current flow can be maintained by the inductivity of the impedance converter. While the primary coil is short-circuited, the current flows by way of the diode of the impedance converter to the inductivity of the impedance converter.

Since the current flow through the inductivity of the impedance converter is maintained during the short circuit of the primary coil of the transformer, the current flows, after termination of the short circuit of the primary coil, with the respective level again through the primary coil without delay. In this way, the original state can be rapidly re-established after the suppression of a spark which is advantageous with respect to the duration of the procedure.

The bridging switch could also short-circuit a secondary coil without essentially affecting the plasma.

It is particularly advantageous if the bridging switch comprises four bridging switch members wherein the primary coil of the transformer is arranged as a transverse member and is energized by the impedance converter. With an arrangement wherein the primary coil is arranged as a transverse member of a bridge, the primary coil can be short-circuited in a simple manner. In addition, with the arrangement of the primary coil as a transverse member of a bridge, the direction of the current through the primary coil can be easily reversed. As a result, the circuit arrangement can be used also for the operation of a dual magnetron.

It is however particularly advantageous with this embodiment of the invention that, during operation without a smoothing member at the exit, a square current pulse is formed at the exit by a periodic transverse switching of the bridge. The pulsed square current is particularly suitable for application to the plasma.

If the bridge switching devices, which are preferably transistors, are controlled in a phase-shifted manner, the pulse width of the exit current can be varied in a simple way. That is, with a change of the direction of the current through the primary coil, the primary coil is short-circuited for a predetermined period. The pulse level can be controlled by the impedance converter.

With the switching arrangement according to the invention, it is furthermore possible in a simple manner to generate an output voltage which is relatively smooth as it is required for special plasmas or, respectively, processes. Switching arrangements according to the invention may be arranged in parallel. With a phase-shifted control of the individual modules, the current interruptions or reductions can be reduced with an increase in the number of modules arranged in parallel. It is particularly advantageous that the residual energy is essentially not increased by the parallel circuit arrangement of the modules.

A parallel circuit arrangement can be set up without problems since the outputs have a current source characteristic. The currents of the individual modules can be controlled individually by the impedance converters.

Because of the current source characteristic of the circuit arrangement according to the invention, the circuit arrangement is particularly advantageous during the discharge of a plasma. The bridge may be arranged in a transverse circuit whereby the primary coil can be short-circuited and, by way of the impedance converter, a small current can be provided. When the bridge is then released that is the primary coil is no longer short-circuited, the voltage at the inductivity of the impedance converter and consequently at the output of the switching arrangement increases if the plasma is not discharged and therefore highly resistive. With this voltage, the plasma can very easily be discharged as it is necessary for example when the plasma is extinguished after the occurrence of an AR In this case, it is very advantageous that, during ignition or discharge, no excessive current occurs suddenly since the inductivity of the impedance converter limits the current increase. This is particularly advantageous if an ARC (short circuit of the output) occurs. The impedance limits the current.

Also, the power supply to the plasma, which, in the normal operating range, has a Z-diode characteristic, is simplified by the inductivity-based current source character.

The invention will be described below in greater detail with reference to the accompanying drawings.

DESCRIPTION OF A PREFERRED EMBODIMENT

Figure 1:
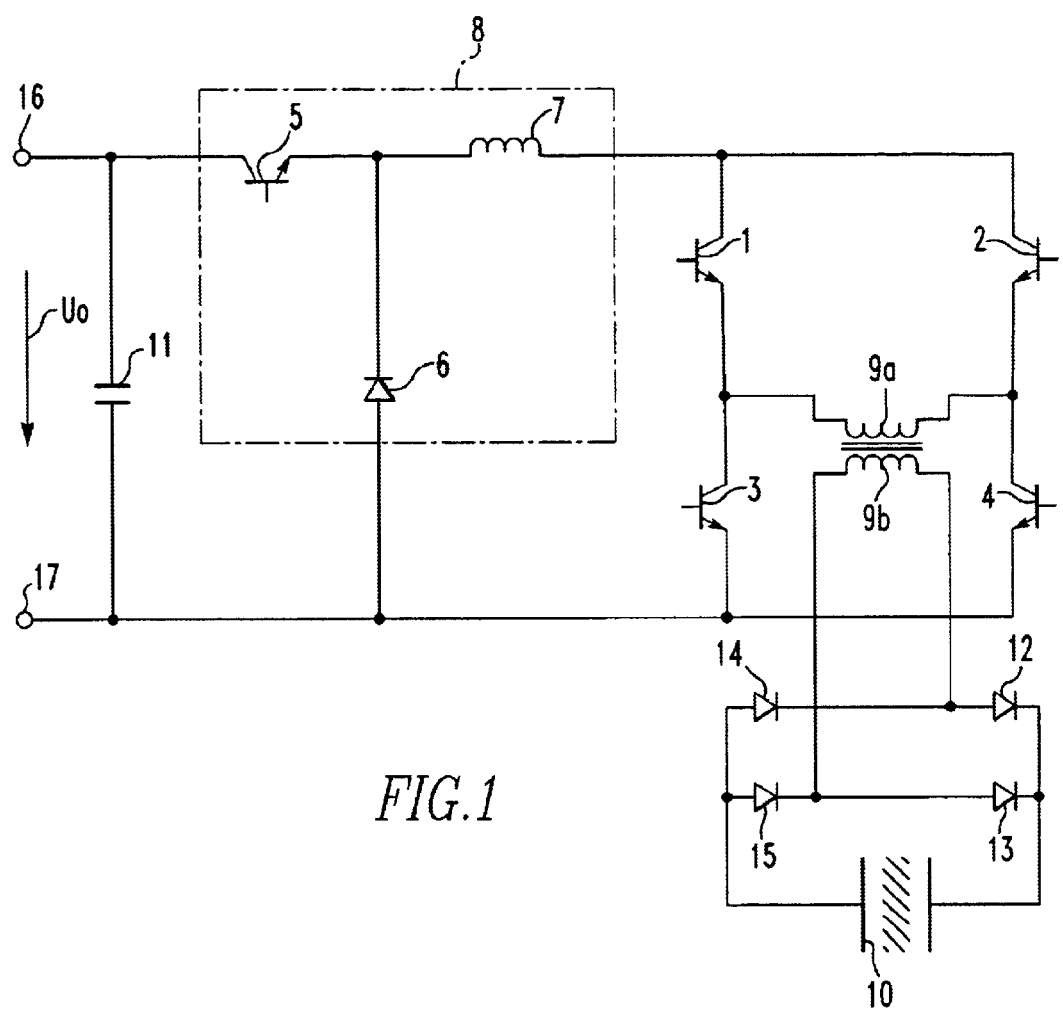
FIG. 1 shows schematically a circuit arrangement according to the invention for operating a plasma.

As shown in FIG. 1, a DC voltage $V_0$ present between the connections 16, 17 at the input end of the circuit arrangement is more or less smoothened by a condenser 11. The DC voltage can be formed for example by a power supply rectifier. The voltage is then applied to a longitudinal switching member in the form of an impedance converter 8 including a switching transistor 5, a first diode 6 and a first inductivity 7. The impedance converter 8 is a conventional device. That is the emitter of the switching transistor 5 is connected to the cathode of the first diode 6 and one end of the first inductivity 7. The other end of the inductivity 7, which forms the output of the impedance converter 8, is connected to the collectors of the transistors 1 and 2 which form the upper part of a bridge. One transistor 1 of the upper transistors 1, 2 forms with a transistor 3 of two lower transistors 3, 4 the left branch of the bridge. The other transistor 2 of the upper transistors 1, 2 forms with the other transistor 4 of the lower transistors 3, 4 the right branch of the bridge. Between the emitters of the upper transistors 1, 2, or respectively, the collectors of the lower transistors, the primary coil 9a of a transformer 9a, 9b is disposed. The two emitters of the lower transistors 3, 4 are connected to the anode of the first diode 6 and the second connection 17 of the input of the circuit arrangement.

The secondary coil 9b of the transformer 9a, 9b is connected to the input of a rectifier bridge consisting of four additional diodes 12, 13, 14, 15. The output of the rectifier bridge is connected to the plasma electrodes 10.

Since no smoothing condenser is arranged at the output of the circuit arrangement, the circuit arrangement operates as a current source. The circuit arrangement can therefore be arranged in a parallel circuit at the secondary side without problem. The parallel circuit arrangement can be provided for example after the rectifier diodes 12, 14, 15. Furthermore, because of the short circuit at the transformer, the circuit arrangement has a very low residual energy. With the circuit arrangement, a controlled discharge can be achieved and the output current can be limited to a maximum value in a simple manner.

The circuit arrangement is also very suitable for the operation of dual magnetrons. To this end, it is only necessary to eliminate the rectifier bridge at the output of the circuit arrangement. Then bi-polar current impulses are obtained whose level can be controlled by the impedance converter and whose width can be adjusted by a phase-shifted control between the upper and the lower transistors of the bridge.

If a spark occurs in the plasma, a branch or both branches of the bridge become conductive and the switching transistor 5 is switched off. As a result, the current flows through the inductivity 7, through the conducting bridge branch and the diode 6 of the impedance converter 8. Because of the reduced resistance in this circuit or, respectively, the very small voltage within this current circuit the current drops only very slowly. After the spark discharge is extinguished, the current can again immediately be supplied to the plasma and almost at the same level as before the discharge. In this way, the original state can rapidly be re-established.

After the plasma discharge, an ignition voltage is again formed automatically.

Figure 2:
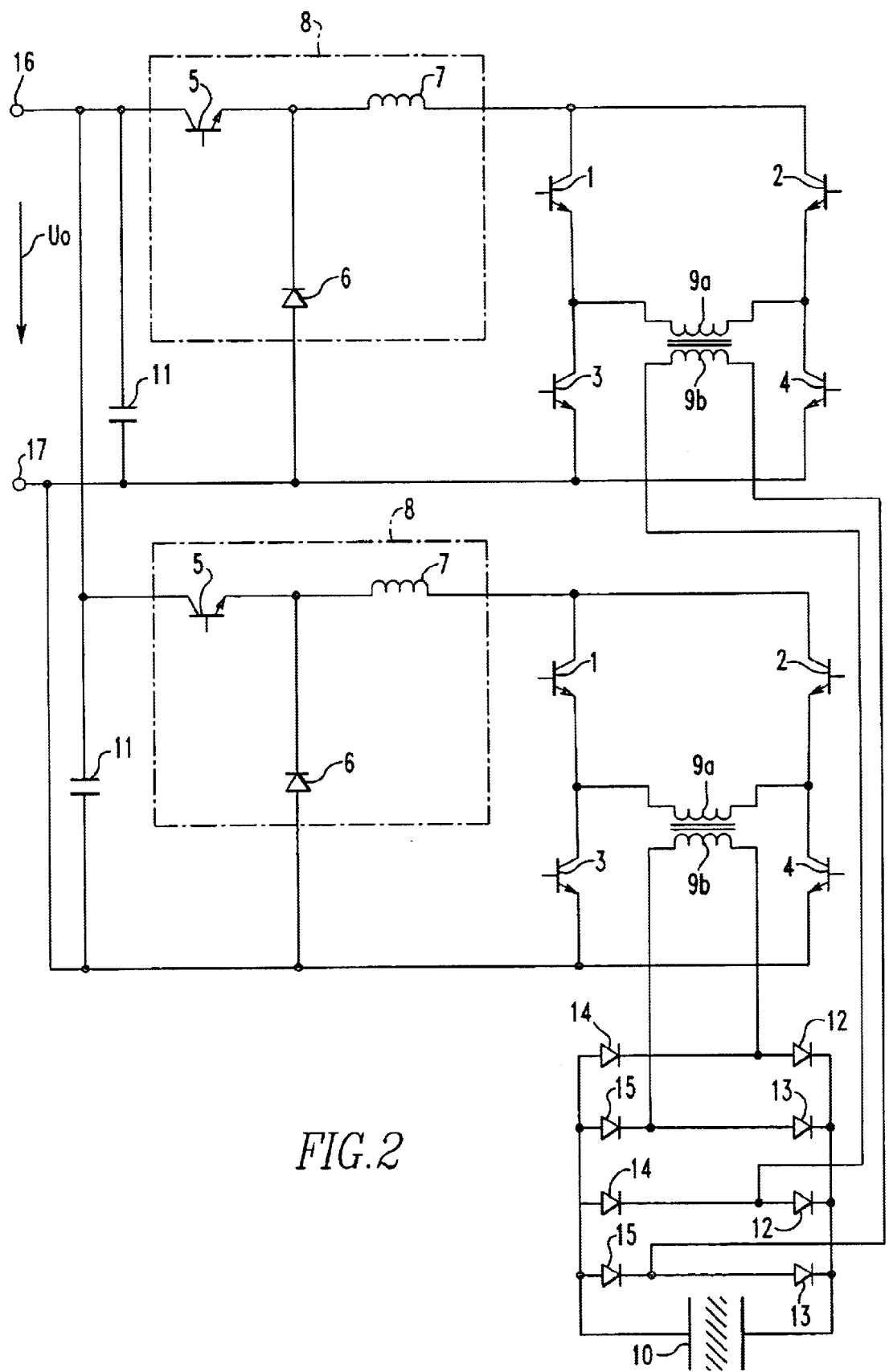
FIG. 2 shows an arrangement with two separate circuits which are interconnected.

For reducing the choppiness, several circuit arrangements may be provided in a parallel circuit as shown in FIG. 2. To this end, secondary coils 9b may be arranged in parallel or the connections of the diodes 12, 13, 14, 15 may be parallel.

What is claimed is:

1. A circuit arrangement for generating a high voltage particularly for the operation of a plasma, comprising at least two separate circuits, each with an impedance converter consisting of a switching member, a first diode and a first inductivity, a transformer including a primary coil and a secondary coil by which said high voltage is provided and bridging switch members arranged in said circuits so as to permit short circuiting at least one of said primary and secondary coils, said secondary coils of said at least two separate circuits being disposed in a parallel circuit arrangement.

2. A circuit arrangement according to claim 1, wherein said bridging switch members consist of a bridge including four bridging switches wherein the primary coil is connected as a cross-over member, power being supplied to said bridging switches by way of said impedance converter.

3. A method for generating a high voltage, particularly for the operation of a plasma, comprising an impedance converter consisting of a switching member, a first diode and a first inductivity, a transformer including a primary coil and a secondary coil by which said high voltage is provided, and bridging switch members arranged in said circuit so as to permit short circuiting one of said primary and said secondary coil, said method comprising the step of short-circuiting one of said primary and secondary coils upon occurrence of an arc discharge and shutting down said impedance converter until the discharge has subsided.

4. A method according to claim 3, wherein said bridging switch members are so switched that the current flow in the primary coil is periodically reversed and, with each reversal, the primary coil is short-circuited for a predetermined period.

* * * * *